(12) United States Patent
Iriguchi et al.

(10) Patent No.: US 6,624,632 B2
(45) Date of Patent: Sep. 23, 2003

(54) METHOD AND APPARATUS FOR SHORTENING T1 OR T2, OR LENGTHENING THE ADC OF A SUBSTANCE BY THE USE OF ELECTRIC CURRENT

(75) Inventors: Norio Iriguchi, J-Kanagawa (JP); Masaki Sekino, Tokyo (JP); Shoogo Ueno, Tokyo (JP); Kikuo Yamaguchi, Saitama (JP)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/044,524

(22) Filed: Jan. 10, 2002

(65) Prior Publication Data
US 2002/0135367 A1 Sep. 26, 2002

(30) Foreign Application Priority Data
Jan. 12, 2001 (JP) ............................ 2001-005278

(51) Int. Cl.⁷ ................................................ G01V 3/00
(52) U.S. Cl. ...................................... 324/309; 324/300
(58) Field of Search .............................. 324/309, 307, 324/300, 312, 314, 306, 318, 322

(56) References Cited
U.S. PATENT DOCUMENTS 5,227,724 A * 7/1993 Cory et al. ................. 324/307
5,317,262 A * 5/1994 Moonen et al. ............. 324/309
5,671,741 A * 9/1997 Lang et al. ................. 600/415
5,757,185 A    5/1998 Hennig ....................... 324/300

OTHER PUBLICATIONS

Tumor Detection By Nuclear Magnetic Resonance, Damadian, Science, vol. 171 (1971) pp. 1151–1153.

"Spin Diffusion Measurements: Spin Echos in the Presence of a Time–Dependent Field Gradient," Stejskal et al., J. Chem. Phys., vol. 42, (1965) pp. 288–292.

"MR Imaging of Intravoxel Incoherent Motions: Application to Diffusion and Perfusion in Neurologic Disorders," Le Bihan et al., Radiology, vol. 161 (1986), pp. 401–407.

* cited by examiner

Primary Examiner—Louis Arana
(74) Attorney, Agent, or Firm—Schiff Hardin & Waite

(57) ABSTRACT

In a method and apparatus for obtaining magnetic resonance data from water-containing substance, nuclear spins are excited in the substance in the presence of a homogenous static magnetic field, while an electrical current is flowing in the subject. The electrical current flowing in the subject shortens the spin-spin relaxation time and the spin-lattice relaxation time, and lengthens the apparent diffusion coefficient of the substance.

6 Claims, 2 Drawing Sheets

METHOD AND APPARATUS FOR SHORTENING T1 OR T2, OR LENGTHENING THE ADC OF A SUBSTANCE BY THE USE OF ELECTRIC CURRENT

BACKGROUND OF THE INVENTION

1. Field of the Invention

The present invention relates to techniques in the field of magnetic resonance imaging (MRI) and magnetic resonance spectroscopy (MRS). The present invention also relates to techniques for measuring the spatial distribution of the electrical properties of substances such as electrolyte solutions, the tissues of a living body and human tissues by the use of MRI or MRS. The present invention relates also to techniques for measuring the spatial distributions of the currents within these substances.

2. Description of the Prior Art

Magnetic resonance signals are high-frequency signals, typically on the order of microvolts, which have weak frequencies produced by the precession of atomic nuclei (spins) in a static magnetic field. The frequency of the precession is determined by the magnetic field strength and the type of nucleus in question. The spins are aligned by the homogenous static magnetic field, and are excited by the application of an RF field, with the resulting magnetic resonance signals being detected as a voltage with a resonant coil (antenna).

An MR image is abbreviated MRI, and the method for acquiring it is called MR imaging which is abbreviated MRI. Further, MR spectral curve is referred to as an MR spectrum which is abbreviated MRS, and the acquisition of it or the method for acquiring it is called MR spectroscopy, which is abbreviated MRS.

Since R. Damadian found in the early 1970s that the spin-lattice relaxation time T1 and the spin-spin relaxation time T2 vary with tissues significantly, and tumorous tissues have extremely longer relaxation times than normal tissues (R. Damadian, "Tissue detection by nuclear magnetic resonance." Science vol. 171: pp. 1151–1153, published in 1971), the relaxation times T1 and T2 have been recognized as very important parameters in developing and designing magnetic resonance imaging systems and obtaining and evaluating magnetic resonance images and spectra.

The relaxation time T1 is the time constant required for the spins excited in a static magnetic field to return to their initial state in which they can be excited again. Accordingly, if T1 of the tissues of a living body or the like (examination subject) is particularly long, then a correspondingly longer time is needed for obtaining the magnetic resonance signals by repeating the excitation, returning the spins to the initial state, and for obtaining MRI or MRS by performing calculations such as two-dimensional Fourier transform or one-dimensional Fourier transform with a computer. In case of a clinical MRI apparatus, the patient, who is not allowed to move during the image pickup, is more burdened. Further, the number of patients who can be imaged over a given time is decreased. Accordingly, it is generally considered better for T1 to be shorter.

The relaxation time T2 is the time constant from a time when many spins are excited in resonance with the RF field (i.e., the field having the same frequency as the frequency of the precession relative to the magnetic flux density of the static magnetic field around the spins), so that the phases of the precessions are uniform and can be detected macroscopically as an induced electromotive force by an external resonance coil, to when the phases become irregular and non-uniform, so that the spins cannot detected. Accordingly, in order to obtain the signals, it is better in many cases for T2 to be long, but there are also many cases where, even if T2 is short, it suffices if the signals are obtained, by an appropriate signal obtaining technique, for instance immediately after the excitation thereof.

Typically, T1 of the gray matter of the brain of the human body is 1.0 when it is measured in a magnetic field of 1T. Further, typically, T2 of the gray matter of the human brain is 0.1. It has been conventionally believed that there is no method or means for changing these relaxation times T1 and T2 in a given static magnetic field (of 1.0 T, 1.5 T or the like) and at a given temperature (substantially 37° C. of the human body) unless some chemical substance or the like is introduced into the human body.

More specifically, it is known that the ions of a magnetic material such as a transition metal and lanthanide ions have unpaired electronic spins which have magnetic moments several hundreds of times as large as protons, and thus have strong relaxation effects. As an application example of such substances, the injection of a gadolinium compound, which is a paramagnetic material, into the circulatory system of an examination subject is widely practiced in the field of clinical MRI. If a gadolinium compound is introduced into the tissue of a living body, it has a relatively larger shortening effect on T1, which is originally long, than on T2 which is originally short.

In other words, if the gadolinium compound is introduced into a vein, then it is absorbed into the blood or the brain tissue or the like if the cerebral blood vessel barrier has been destroyed by a cerebral infarction or the like. This selectively shortens the T1 of the tissue, so that the site of disease or the like can be selectively imaged or depicted in a T1-weighted image (that is, an image which is generated, by obtaining successive sets of magnetic resonance signals by repeating the excitation after each return of the spins to the initial state.) In such an image a substance which has a short T1 and is therefore apt to return to the initial state in which, even if previously excited, it can be excited again, produces a higher amplitude signal and thus appears brighter in the image.

A T2-weighted image is generated from a signal that is not obtained immediately after the excitation, but is obtained as a dark signal after waiting for a substance with a shorter T2 to become irregular and non-uniform in phase by the T2 relaxation and become undetectable.

Further, in the middle 1960's, E. O. Stejskal and J. E. Tanner developed a diffusion measurement method by nuclear magnetic resonance that uses a motion probing gradient (MPG) pulses. [E. O. Stejskal and J. E. Tanner, "Spin diffusion measurements: spin-echoes in the presence of time-dependent field gradient." J. Chem. Phys. Vol. 42: pp. 288–292, published in 1965].

This is a method of measuring the magnitude of the movement of spins as a diffusion coefficient by utilizing the fact that, as long as the spins perform a precession at a stationary position, no influence is exerted even if two gradient magnetic fields which are identical in magnitude but opposite in direction are successively applied as MPG pulses, but, if the spins are moved by the diffusion, then the phases are made irregular and non-uniform eventually by the application of the MPG pulses. The MPG pulses may be applied by making them identical with each other in magnitude and direction and putting 180° RF pulses between them.

Further, D. Le Bihan, etc. introduced MRI techniques that incorporate MPG pulses into imaging sequences of MRI in mid-1980s. [D. Le Bihan, E. Breton, D. Lallemand, P. Granier, E. Cabanis and M. Laval-Jeantet, "MR imaging of intravoxel incoherent motions: application to diffusion and perfusion in neurological disorders." Radiology Vol. 161: pp. 401–407, published in 1986].

Since then, the diffusion-weighted MRI techniques have been widely used as a very important imaging methods because, for important lesions like acute cerebral infarctions which cannot be depicted, unless two or three days lapse after the beginning of the disease, by T1-weighted imaging or T2-weighted imaging. Using diffusion-weighted imaging, these important lesions are imaged 20 to 30 minutes after the development of the disease.

The diffusion of certain molecules in the same substance, such as water molecules diffusing in water, is called self-diffusion. Accordingly, the diffusion coefficient of a substance itself refers to the self-diffusion coefficient. Self-diffusion is originally isotropic. However, among the movements of spins in living bodies, etc., not only do movements due to diffusion occur, but also some movements due to blood flow occur. More precisely, therefore, the measured diffusion coefficient of the water molecules is called the apparent diffusion coefficient (ADC). In particular, if the gradient factor attenuation value (which is sometimes abbreviated b-factor) that is determined dependent on the magnitude, the length in time and the pulse interval of each of the MPG pulses) is very small, the detection of only the movement due to the diffusion of the spins is very difficult, because the movement of the spins due to the blood flow, etc. also is detected. However, MPG pulses of such a degree that are in practical use in ordinary diffusion-weighted imaging sequences in clinical MRI, etc. at present can make the ADC value almost equal to the diffusion coefficient by sufficiently increasing the b-factor. Concerning the b-factor, details are given in the above-mentioned literature of Le Bihan, etc.

Further, a method of making a measurement by magnetic resonance while flowing an electric current through an electrolyte solution, is disclosed in U.S. Pat. No. 5,757,185.

The aforementioned patent states that by flowing an electric current, changing with time, the motion of the ions or molecules caused only by the electric current can be detected by nuclear resonance, with respect to the direction in which the gradient magnetic field is applied. Motion caused by diffusion is not detected.

There is no discussion in the aforementioned patent that applying an electric current through an electrolyte solution has any effect on T1 or T2. Moreover, the technique according to the aforementioned patent for detecting the motion of the ions or molecules produced by an electric field and thus differs from known techniques for detecting the self-diffusion that develops isotropically.

SUMMARY OF THE INVENTION

It is an object of the present invention to provide a technique for markedly shortening T1 or T2 of a water-containing substance such as an electrolyte solution, the tissues of a living body or human tissues without using an intravenous injection or the like of a paramagnetic material such as a gadolinium compound or the like.

Another object of the present invention is to provide a technique for markedly increasing the ADC of a water-containing substance, so that the diffusion-weighted sensitivity is enhanced, in the context of a diffusion-weighted MRI or diffusion-weighted MRS.

Still another object of the present invention is to provide a technique for measuring the spatial distribution of the electrical properties of a water-containing substance by the use of MRI or MRS.

Still another object of the present invention is to provide a technique for measuring the spatial distribution of the electric currents in the interior of a water-containing substance by the use of MRI or MRS.

The first object is achieved in accordance with the present invention wherein, by applying an electric current through a water-containing substance, T1 or T2 of the substance is reduced.

The first object also is achieved in accordance with the present invention in a method for obtaining magnetic resonance images or spectra wherein a water-containing substance is placed in a static magnetic field, and, by a radio-frequency magnetic field, nuclear spins in the substance are excited to generate magnetic resonance signals, and wherein, by applying an electric current through said substance, the T1 or T2 of the substance is reduced.

The second object is achieved in accordance with the present invention wherein by applying an electric current through a water-containing substance, the apparent diffusion coefficient (ADC) of the substance is increased.

The second object also is achieved in accordance with the present invention also lies in a method for obtaining a magnetic resonance image or spectrum wherein a water-containing substance is placed in a homogeneous static magnetic field, and, by a radio-frequency magnetic field, nuclear spins in the substance are excited to generate magnetic resonance signals, and wherein, by applying an electric current through the substance, the ADC of the substance is increased.

The third and fourth objects are achieved in accordance with the present invention in a method for obtaining a magnetic resonance image or spatial information representing an electrical property of a water-containing substance wherein a T1-weighted, T2-weighted or diffusion-weighted magnetic resonance image, or localized magnetic resonance spectra is/are obtained,while applying an electric current through the substance, and wherein these images or spectra are compared to images or localized spectra obtained without applying the electric current.

The water-containing substance can be an electrolyte solution or the tissues of a living body.

The first object also is achieved in accordance with the present invention in an apparatus for obtaining a magnetic resonance image of a water-containing substance having a basic field magnet which generates a homogeneous static magnetic field, an RF system which generates a radio-frequency field, a gradient system which generates gradient magnetic fields, and a computer which generates an image from the received magnetic resonance signals and an arrangement for applying an electric current through the substance while the nuclear spins are processing, to reduce T1 or T2 of the substance.

A further embodiment of the present invention is an apparatus for obtaining a magnetic resonance image of a water-containing substance having a basic field magnet which generates a homogeneous static magnetic field, an RF system which generates a radio-frequency magnetic field, a gradient system which generates gradient magnetic fields, and a computer which generates an image from the received magnetic resonance signals, and an arrangement for applying motion probing gradient (MPG) pulses through the substance, and an arrangement for applying an electric current through the substance, to increase the ADC of the substance as the magnetic resonance signals are being generated and received.

A further embodiment of the present invention is a method for obtaining spatial information, by magnetic resonance, representing the internal electric current evoked in a water-containing substance, wherein T1-weighted or T2-weighted or diffusion-weighted magnetic resonance images or localized magnetic resonance spectra while an internal current is caused to flow in the substance, and wherein images or localized spectra are obtained without an internal current flowing in the substance, which are compared to the images or the localized spectra obtained with the internal current.

Even if the internal current is evoked in the tissue of a living body instead of being externally applied, the present invention can be practiced. In particular, even if the electric current in the tissue of a living body is evoked by an external stimulus to the living body tissues or by the internal brain activity in the living body, the present invention can be practiced.

The main cause for the relaxation phenomenon of the spins excited in water lies in the dipole-dipole interaction. One water molecule has two protons. Each rotates with a positive charge, as a result of which a magnetic field is emitted as a magnetic dipole having an N pole and an S pole. Moreover, the individual protons are each disposed within the magnetic fields emitted by surrounding protons. Further, each water molecule is experiencing thermodynamic molecular motion (Brownian motion). The correlation time (i.e., the time constant when the state at a certain instant is lost by the thermodynamic molecular motion, which becomes shorter as the thermodynamic molecular motion increases of the thermodynamic molecular motion of water existing as a liquid is much shorter than the cyclical period of the spin precession.

If the correlation time of the thermodynamic molecular motion reaches the same order as that of the cyclical period of the spin precession, many protons are subjected to radio-frequency magnetic fields generated by the other protons, on the same order as that of the precessions, and accordingly on the same order as the resonance frequencies but having various frequencies on the same order as the precessions, and accordingly on the same order as that of the resonance frequencies, but the protons exhibit various frequencies, like white noise. Then, the spins excited by the radio-frequency magnetic fields with a single resonant frequency from the outside cannot keep the excitation state any longer and thus become relaxed. This is the T1 relaxation caused by the dipole-dipole interaction.

Further, if the correlation time of the thermodynamic molecular motion becomes very long, then one proton also is disposed in a static magnetic field produced by the magnetic fields emitted from the other protons, so that the precession which would otherwise occur at a cyclical period due to the constant external magnetic field, is disturbed by the existence of many surrounding protons, and thus becomes irregular and non-uniform. This is the T2 relaxation caused by the dipole-dipole interaction.

On the other hand, one water molecule has two protons which have positive charges and one oxygen nucleus which has a negative charge, bonded at an angle of about 105°, and therefore, the molecule itself is a weak electric dipole. For example, in saline solution, sodium and chlorine exist in an ionized state, and the electric dipoles of the water molecule are attracted or repulsed by the dissociated ions, forming, around the individual electrolytic ions, many semi-stable structures, called hydration shells, containing many water molecules. Semi-stability refers to the state in which the total number of the electric dipoles does not change significantly with time, but replacement of the dipoles by surrounding dipoles is constantly taking place. Also in human body tissue, sodium ions of about 150 mM exist in the extracellular fluid and potassium ions of about 150 mM exist in the intracellular fluid, so that, around these ions, hydration shells are formed.

When an electric current is applied, the electrolytic ions move together with the hydration shells in a manner taking many water molecules with them. It is believed that, in this case, the thermodynamic molecular motion of the water molecules is restricted by the movement of the electrolytic ions, so that the correlation time is changed. As a result, the above-mentioned T1 relaxation and T2 relaxation based on the above-mentioned dipole-dipole interaction are caused, and T1 and T2 become markedly shorter.

Further, it is believed that, if an electric current is applied, the electrolytic ions move with the hydration shells in a manner taking many water molecules with them, as a result of which the movement of the water molecules is caused, and thus the ADC is remarkably increased. Here, the important feature pertaining to the increase of the ADC in the present invention is that the increase is developed isotropically. The mechanism therefor is believed to be in that the replacement, in a direction perpendicular to the movement, of the water molecules with the surrounding water molecules, which is caused by the movement of the hydration shells, occurs isotropically. Therefore, it is believed that the increase of the ADC in the present invention is also due to the fact that the diffusion coefficient substantially increases.

Further, T1-weighted or T2-weighted images or diffusion-weighted images can be obtained while applying an electric current through a water-containing substance, and a comparison is made between these images and corresponding control images obtained without applying an electric current. Such a comparison can be subtraction or division of attributes the images, or image calculations such as statistical inspection, etc. among many images. The tissues through which the electric current flow is higher exhibit a greater T1 shortening effect or T2 shortening effect or ADC increasing effect according to the present invention. Therefore, images in which the distribution of the electrical conductivity is represented can be obtained.

Further, according to the present invention, T1-weighted images can be obtained while applying an electric current through a water-containing substance, then T1 is shortened, as a result of which the intensity of the signals obtained is markedly high, and therefore the obtained images are bright. Alternatively, a T1-weighted image can be obtained with a "conventional" brightness but the scan can be completed in a shorter time as a whole in connection with MRI or MRS. Accordingly, in a clinical MRI apparatus, the stores the patients can be markedly reduced and patient throughput can be increased.

Further, according to the present invention, diffusion-weighted images can be obtained, while applying an electric current through a water-containing substance, causing the ADC to be markedly increased, as a result of which images in which the contrast of the signals obtained is markedly strong are obtained.

The present invention is based on the finding that, when an electric current exists in a water-containing substance, T1 or T2 is shortened, or ADC is increased. The electric current which yields such effects need not be applied from outside the subject, but can be evoked internally, such as in the case of the water-containing substance being tissue in a living body, such as brain tissue.

More specifically, the brain evokes an electric current internally in response to an external stimulus or by internal brain activity. In a living body, the nerve tissues of the brain or the like are relatively easy to supply with an electric current, and as a result of the application of the electric current, a natural biomagnetic field is generated. The intensity of such electric fields emitted in the surrounding electrolyte, however, is small. Further, the duration of the electrical activities is very short in many cases.

Thus, T1-weighted or T2-weighted or diffusion-weighted magnetic resonance images or local magnetic resonance spectra are obtained when an internal electric current exists and when no internal electric current exists, and, between the data obtained when the internal electric current exists and the data obtained when no internal electric current exists, a comparison is made by performing subtractions and divisions or, among many datasets, a comparison is made by performing statistical inspection, etc. This allows information pertaining the spatial distribution of the internal currents and/or magnetic resonance images which represent the spatial distribution of the internal currents to be obtained.

DESCRIPTION OF THE PREFERRED EMBODIMENTS

Figure 1:
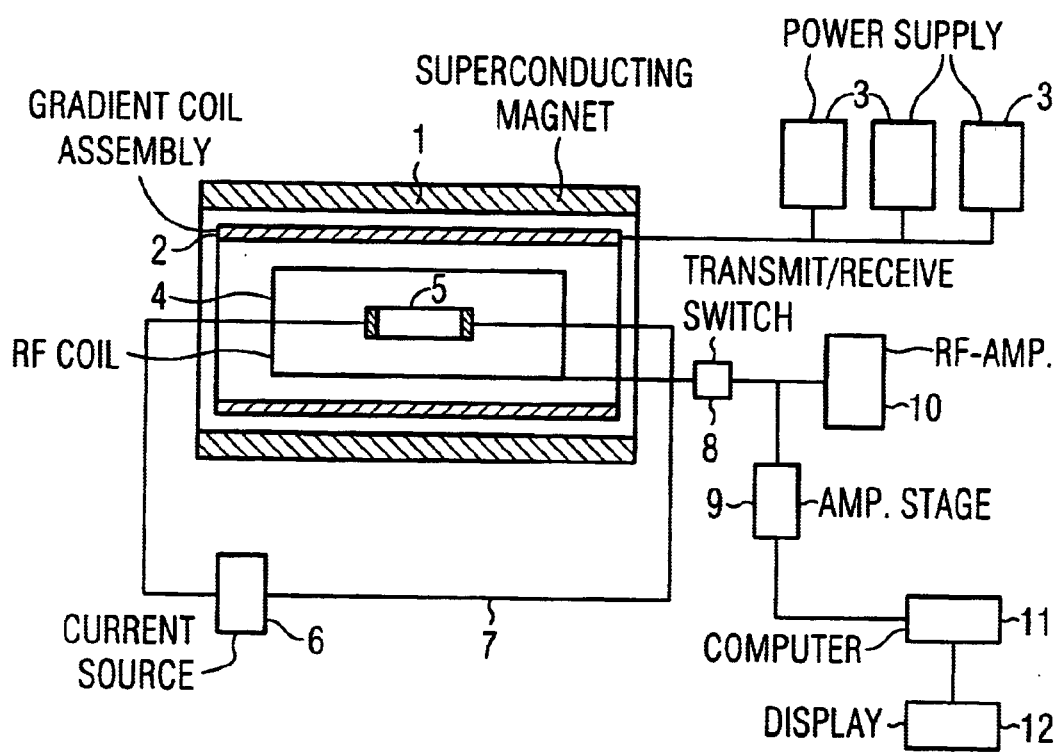
FIG. 1 is a block diagram showing the structure of the apparatus according to an embodiment.

FIG. 1 is a block diagram showing the basic structure of an apparatus according to an embodiment of the present invention.

Referring to FIG. 1, a phantom sample of an electrolyte solution 5 is placed in the static magnetic field of a horizontal superconducting magnet 1 of an MRI apparatus. The phantom sample 5 is connected to a current source 6 through a lead wire 7. The MRI apparatus also has a gradient magnetic field coil assembly 2 and a radio-frequency coil 4. The gradient magnetic field coil assembly 2 is supplied with an electric current from an electrical power supply 3 for the gradient magnetic field coil or coils, and produces gradient magnetic fields in the homogeneous static magnetic field volume of the magnet 1.

The gradient magnetic field power supply 3 is operated by a command sent from an unillustrated man-machine interface. Power is supplied to the radio-frequency coil 4 in a transmit mode via a transmit/receive changeover switch 8 from a radio-frequency amplifier 10, causing spins to be excited in the phantom sample 5. Conversely, in a reception mode the magnetic resonance signals generated by the proton spins are detected as an induced electromotive force by the radio-frequency coil 4 and are sent to a computer 11 through the transmit/receive changeover switch 8 and an amplifier stage 9 (for example a pre-amplifier and an intermediate amplifier). After known data processing such as Fourier transformation, etc., In the computer 11, data are supplied to a display 12 as MRI or MRS data. The radio-frequency amplifier 9 is also operated by the command sent from the man-machine interface.

According to the present invention, the electrical current applied from outside to a tested subject (in case of FIG. 1, the phantom sample 5) is an alternating current of 10 Hz or below, preferably 2 Hz or below, or a direct electric current. The lower the frequency, the larger the T1 shortening effect, the T2 shorting effect and the ADC increasing effect become, and the use of DC current is the most effective. In case of cellular tissues constituting a living body, AC currents are easier to conduct than DC currents, and a suitable frequency range thereof is 0.1 to 1.0 Hz.

In the present invention, if the subject is a human body the density of the electric current applied from the outside must be set to 50 mA/cm$^2$ or below to avoid a possible danger. The current density should preferably is 10 mA/cm$^2$ or below and more preferably is 5 mA/cm$^2$ or below for non-invasion measurement.

On the other hand, in most cases the higher the current density is, the larger the T1 shortening effect and the ADC increasing effect will be. The practical current density range is 0.02 to 2.0 mA/cm$^2$ and preferably is 0.05 to 1.0 mA/cm$^2$ However, these current values should be set to lower values for safety if the invention is applied to a human body in the medical field, since the brain and the heart are organs which generate currents by themselves. Also in the fields of biology, veterinary medicine, botany, etc., the present invention exhibits marked effects as long as a water-containing substance is the subject, for shortening T1 or T2 or increasing ADC to perform MRI or MRS. When the present invention is employed for measuring the physical properties of water-containing substances other than the human body, allowable current values appropriate for the respective substances may of course be employed.

In the present invention, an electric current can be applied through an electrically conductive paste by the use, as electrodes, of non-magnetic metal foils, graphite plates or carbon powder-containing rubber plates. Where the tested subject is covered by an electrically conductive body, then radio-frequency eddy currents are caused to flow though the conductive body by the external radio-frequency field used for the excitation of spins, and thus the external RF field does not reach the interior of the tested subject. In an exemplary embodiment of the inventive method, an electrically conductive rubber band is placed around the wrist as one electrode, and another electrically conductive rubber band is placed around the upper arm as the other electrode, and an electric current is caused to flow between the wrist and the upper arm.

An external DC or low-frequency AC power source unit for this current, which has a magnetic component, cannot be brought near the MRI apparatus or MRS apparatus. A current-regulated power source would produce a location at the tested subject, at which the electric current flows in a concentrated manner, and thus for safety a voltage regulated power source is better in many cases. The wire extending from the power source to the electrode in the strong magnetic field will experience a force according to Fleming's left-hand rule depending on the magnitude of the electric current, and therefore this conductor is preferably a twisted pair so that the current flows in opposite directions parallel to the static magnetic field as much as possible, or the conductor can be rigidly fixed in the magnetic field.

Figure 2:
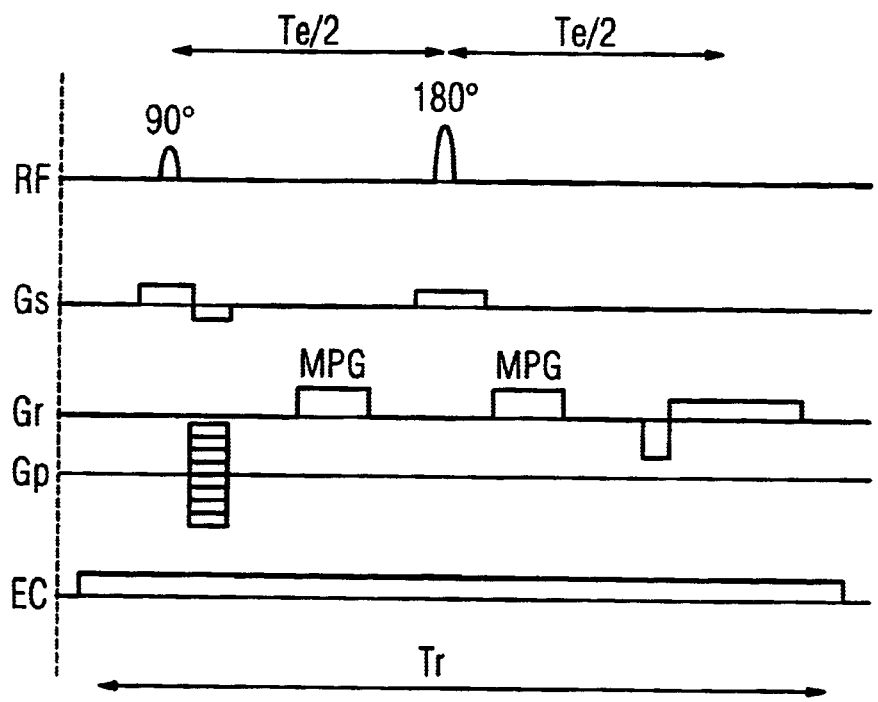
FIG. 2 is a chart showing an example of the diffusion-weighted spin echo imaging sequence according to an embodiment of the present invention.

In order to obtain diffusion-weighted image data, it is necessary to use MPG pulses as shown in, e.g., FIG. 2.

Referring to FIG. 2, RF indicates the RF pulses. Further, Gs indicates the output of the gradient magnetic field coil for slice selection. Further, Gr indicates the output of the gradient magnetic field coil for reading-out signals. Gp indicates the output of the gradient magnetic field coil for phase encoding. EC indicates the electric current applied though the tested subject.

Referring to FIG. 2, the RF pulses are applied in a direction perpendicular to the static magnetic field. If so, the many individually processing spins existing in the water-containing substance, which were directed as a whole in the direction of the static magnetic field, flip by 90° as a whole in resonance with the RF pulses. This is the first 90° pulse shown in FIG. 2.

If the second pulse (a 180° pulse twice having twice the amplitude of the 90° pulse in the example of FIG. 2) is applied to the spins thus excited, then an echo signal is generated for the same time as the time Te/2 ranging from the application of the first excitation pulse (i.e., the 90° pulse) to the application of the second pulse and after a time Te lapses from the application of the first excitation pulse. This echo signal is called spin echo, and the time Te is called echo time.

At the instant when the 90° pulse or the 180° pulse is applied, pulses of the gradient magnetic field Gs for slice selection are applied. As is known as gradient magnetic field is a magnetic field which gives a linear gradient to the static magnetic field, and the spins perform precessions only at the frequency determined depending on the magnetic field intensity. Thus, it follows that, with respect to the radio-frequency field having a fixed frequency, the excitation by the 90° pulse and the generation of the echo signal by the 180° pulse each take place only at specific position with respect to one axis in space. This is the slice selection achieved by the gradient magnetic field Gs.

Next, when the echo signal which is generated after the time Te lapses is read out (in other words, the echo signal is detected as an induced electromotive force by the radio-frequency coil 4), the gradient magnetic field Gr is applied. This gradient magnetic field Gr is applied to the signal source, i.e., all the spins are differently spatially distributed. The gradient magnetic field Gr is a magnetic field which gives a linear gradient to the second spatial axis (i.e., an axis different from the axis for which the slice selection was made).

By the gradient magnetic field Gr, the echo signal from a specific slice is modulated with the frequency determined depending on the second spatial axis, and the radio-frequency coil 4 detects the echo signal as one signal containing the various frequencies of all of the spins in the slice. This signal is a signal on a time axis, that is, a signal which varies with time. When this signal is Fourier-transformed by the computer ii, then it is represented as a signal on a frequency axis. The frequency axis corresponds to the second spatial axis, so that the distribution of the spins along the second axis is identified.

Referring to FIG. 2, the MPG pulses are applied, by the use of the gradient magnetic field Gr, in the same direction with the 180° pulse interposed there between. The MPG pulses have a function as already mentioned. When readout of the echo signal is completed, the 90° pulse is applied again. The time from the application of the first 90° pulse to the application of the second 90° pulse is the repetition time Tr.

During the period from the excitation by the second 90° pulse to the second readout, the gradient magnetic field Gp is applied for a fixed time with a size changed by a fixed amount from the size applied at the first time. If the gradient magnetic field Gp is applied for a fixed time to the spins which perform precessions at a fixed frequency, then the precessions of the spins advance by a phase determined by the magnitude of the gradient magnetic field Gp. This gradient magnetic field Gp is a gradient magnetic field in the direction of the third spatial axis.

If signals are obtained repeatedly, the changes in the phase of the echo signal read out in each repetition represents the spatial distribution of the spins with respect to the direction of the third axis. Thus, if a Fourier transformation is made by the computer 11 with respect to the direction of the third axis, the phase axis corresponds to the third spatial axis, and thus the distribution of the spins along the third axis is identified. This is the diffusion-weighted spin echo imaging sequence.

The computer 11 performs a two-dimensional Fourier transformation with respect to one dataset comprising several echo signals measured repeatedly, and supplies the result to the display 12 as a magnetic resonance image.

It will be understood that if diffusions are not to be detected, the MPG pulses are not applied.

Figure 3:
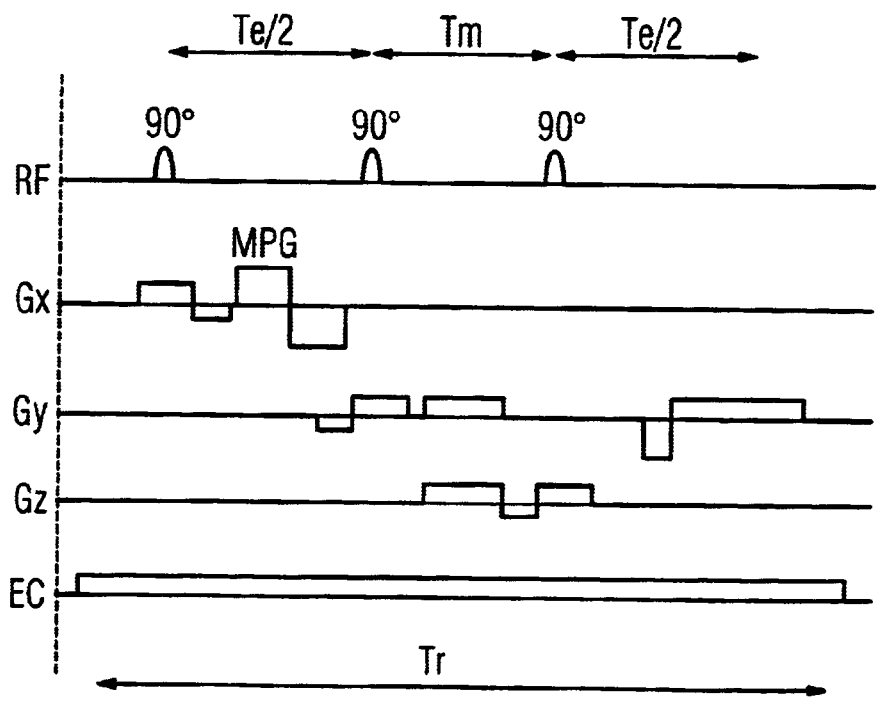
FIG. 3 is a chart showing an example of the diffusion-weighted MRS obtaining sequence according to an embodiment of the present invention.

Next, referring to FIG. 3, three gradient magnetic fields Gx, Gy and Gz correspond to three directions in space and are for specifying one rectangular parallelepiped in the interior of the tested subject. Referring to FIG. 3, three 90° pulses are applied. If three 90° pulses are applied as mentioned above, then, after the application of the third 90° pulse, an echo signal is generated for the same time as the time Te/2 ranging from the application of the first 90° pulse to the application of the second 90° pulse and after the time, Te+Tm, from the application of the first excitation pulse. This echo signal is called a stimulated echo and this stimulated echo is detected as an induced electromotive force by the radio-frequency coil 4. The time Tm ranging from the application of the second 90° pulse and the application of the third 90° pulse is called the mixing time.

Every time three 90° pulses are applied, one of the gradient magnetic fields Gx, Gy and Gz in the three spatial directions is applied. In this way, slice selection is performed with respect to the three axes in space, and the stimulated echo signals obtained are those only from within the rectangular parallelepiped in which the slices in three directions intersect each other, and, from this sequence, a diffusion-weighted localized MR spectrum is obtained.

In FIG. 3 EC again designates the electric current applied through the tested subject. Referring to FIG. 3, the MPG pulses are applied to the gradient magnetic field Gx, with two pulses applied with the same magnitude but in opposite directions. The function of these MPG pulses is as described above. Again, if no diffusion is to be detected, no MPG pulse is applied.

In the present invention, in order to detect a diffusion developing isotropically, the b-factor of the MPG should be set to 0.02 to 2,000 s/mm$^2$ and preferably to 0.2 to 200 s/mm$^2$. This is because, if the b-factor is small, the influence by the flow of ions or molecules can be contained. If the b-factor is large, then the burden in the manufacture and use of hardware such as the gradient magnetic field coil, etc. is increased.

The embodiment of the present invention will be further described, with reference to a few examples.

EXAMPLE 1

An acrylic column with a 26 mm inner diameter and 45 mm in length was filled with physiological saline solution.

The column was placed as the phantom sample 5 in the magnetic field of an MRI machine of 1.5 T shown in FIG. 1. Further, the column was connected to the electric current source 6 through the lead wire 7.

T1 values were measured by an inversion recovery (IR) sequence, applying an electric current to the phantom sample. Further, T2 values were measured by a Carr-Purcell-Meiboom-Gill (CPMG) sequence. The measurement was made with respect to the whole solution in the column as the subject, applying a direct electric current via platinum planer electrodes of both ends of the column.

When the current density was 0.0 mA/cm$^2$ (in other words, when no current was applied), T1 and T2 were 2.8 and 2.1 seconds respectively. When the current density was 1.0 mA/cm$^2$, T1 and T2 were 2.2 and 1.7 seconds respectively. When the current density was 2.0 mA/cM$^2$, T1 and T2 were 1.8 and 1.5 seconds respectively.

In this case, the results obtained when the electric current was applied in parallel to the static magnetic field (i.e., the length direction of the column was set in parallel to the static magnetic field) and when the electric current was applied perpendicular to the static magnetic field (i.e., the length direction of the column was set perpendicular to the static magnetic field), and when the electric current was applied in a direction oblique to the static magnetic field, were the same. Thus, it has also been shown that the T1 shortening effect and the T2 shortening effect of the electric current in the present invention are isotropic.

EXAMPLE 2

The acrylic column with a 26 mm inner diameter and 45 mm in length was filled with physiological saline solution. This column was placed in the magnetic field of the MRI machine of 1.5 T, wherein the length direction of the column was set in parallel to the static magnetic field. An MRI image was obtained by the use of a T1-weighted spin echo imaging sequence with a repetition time Tr=300 and an echo time Te=25 ms, applying a direct electric current via platinum planer electrodes of both ends the column.

It was confirmed that the image of which the surface perpendicular to the static magnetic field was a section, the image of which the surface parallel to the static magnetic field was a section, and the image of which a surface oblique to the static magnetic field was a section were all markedly brighter than the images obtained under the same conditions without the application of an electric current, and, in the former, T1 was shortened and isotropically shortened.

Similar imaging experiments were conducted with a repetition time Tr=225 ms, applying an electric current. As a result, the signal intensities of the images obtained were comparable to the signal intensities of the images obtained with application of no electric current and with Tr=300 ms, whereby the imaging time as a whole was reduced by ¼ with the electric current.

EXAMPLE 3

Two aluminum plate electrodes of each 25 cm$^2$ were attached with conductive glue to both anterior and posterior sides of a human forearm, and the outer side thereof were wound with a cotton bandage. An MRI image was obtained by the use of a T1-weighted spin echo imaging sequence with a repetition time Tr=300 ms and an echo time Te=25 ms, applying a direct electric voltage of 8.0 V to the forearm via the electrodes.

It was confirmed that the muscle region where an electric current was allowed to flow through, produced signals brighter than the image obtained under the same condition without applying any electric current; and the T1 was shortened.

EXAMPLE 4

The acrylic column with a 26 mm inner diameter and 45 mm in length was filled with physiological saline solution. The column was placed as the phantom sample 5 in the magnetic field of the MRI machine of 1.5 T as shown in FIG. 1. The ADC was measured by a spin echo imaging sequence with a set of MPG pulses as shown in FIG. 2, with Tr=5000 ms and Te=60 ms, applying a direct electric current via the platinum planer electrodes of both ends of the column. The MPG pulses were applied using a Gr gradient magnetic field as shown in FIG. 2, and the gradient factor attenuation value (b-factor) was set to 25 s/mm$^2$.

When the current density was 0.0 mA/cm$^2$ (that is, when no current was applied), the ADC was 0.0021 mm$^2$/s. When the current density was 0.2 mA/cm$^2$, the ADC was 0.020 mm$^2$/s. When the current density was 0.5 mA/cm$^2$, the ADC was 0.079 mm$^2$/s. In this case, the same result was obtained when the electric current was applied in parallel to the static magnetic field, when they were applied perpendicular to the static magnetic field, and when it was applied in a direction oblique to the static magnetic field. Thus, it was also proved that the ADC increasing effect according to the present invention was isotropic.

EXAMPLE 5

The acrylic column with a 26 mm inner diameter and 45 mm in length was filled with physiological saline solution. The column was placed in the magnetic field of the MRI machine of 1.5 T, wherein the length direction of the column was set in parallel to the static magnetic field. MRI images were obtained by a diffusion-weighted spin echo imaging sequence with MPG pulses and with Tr=5000 ms and Te=60 ms, applying a direct electric current of 0.2 mA/cm$^2$ via the platinum planer electrodes of both ends of the column. The gradient factor attenuation value of the MPG was set to 25 s/mm$^2$.

The image of which the surface perpendicular to the static magnetic field was a section, the image of which the surface parallel to the static magnetic field was a section, and the image of which a surface oblique to the static magnetic field was a section, were all remarkably darker than the images obtained under the same conditions without application of an electric current; and thus it was confirmed that the ADC was remarkably increased and isotropically increased.

EXAMPLE 6

Two aluminum plate electrodes of each 25 cm were attached with conductive glue to both anterior and posterior sides of a human forearm, and the outer side thereof was wound with a cotton bandage. An MRI image was obtained by a diffusion-weighted spin echo imaging sequence with MPG pulses and with Tr=5000 ms and Te=60 ms, applying a direct electric voltage of 8.0 V to the forearm via the electrodes. The MPG gradient factor attenuation value of the MPG was set to 42 s/mm$^2$.

It was confirmed that the muscle region where the electric current was allowed to flow through, produced signals markedly darker-intensity than the image obtained under the same conditions without applying an electric current; and the ADC was markedly increased.

EXAMPLE 7

A spherical glass phantom of 18 cm in inner diameter was filled with physiological saline solution. An electrical dipole of 4 cm in length, both ends of which were positive and negative electrodes, was installed in a submerged state at the center of the phantom. Lead-wires were led out from the center and twisted in the phantom so that electromagnetic effects of external currents were canceled. By applying electric voltage from outside, an electric current of 1 mA was made to flow through the spherical saline solution phantom directly from the electrical dipole. T1-weighted (Tr=300 ms, Te=25 ms), T2-weighted (Tr=5000 ms, Te=60 ms) and diffusion-weighted (Tr 5000 ms, Te=60 ms, and MPG Gradient Factor Attenuation b=25 s/mm$^2$) spin echo magnetic resonance images were obtained.

As a result, it was confirmed that, in case an electric voltage was applied to an electrical dipole, representing the distribution of an electric current around the electrical dipole, T1 and T2 reduction and diffusion increase were clearly exhibited, as compared with the case where no electric voltage was applied to the electrical dipole.

As mentioned above, according to the present invention, the T1 and T2 of a water-containing substance can be remarkably shortened without using a paramagnetic material or the like such as a gadolinium compound or the like. By shortening the T1, the measuring time of MRI or MRS can be shortened. Further, by the present invention, the ADC of a water-containing substance can be markedly increased.

Further, according to the present invention, the spatial distribution of the electrical properties of a water-containing substance can be measured. Further, according to the present invention, the spatial distribution of the electric currents in the interior of a water-containing substance can be measured. The above-mentioned measurements can all be performed in a non-invasion manner in case a living body is used as the tested subject.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating magnetic resonance data, selected from the group consisting of image data and spectrum data, comprising the steps of:
   placing a water-containing substance in a homogenous static magnetic field;
   applying a radio-frequency field to said substance and thereby exciting nuclear spins in said substance;
   while said nuclear spins are excited, applying an electrical current through said substance and thereby reducing at least one of spin-lattice relaxation time and a spin-spin relaxation time in said substance; and
   obtaining a nuclear magnetic resonance signal from said substance resulting from said spins.

2. A method as claimed in claim 1 wherein said water-containing substance is selected from the group consisting of an electrolyte solution in a living body, and tissue in a living body.

3. A method for generating magnetic resonance data, selected from the group consisting of image data and spectrum data, comprising the steps of:
   placing a water-containing substance in a homogenous static magnetic field;
   applying a radio-frequency field to said substance and thereby exciting nuclear spins in said substance;
   while said nuclear spins are excited, applying an electrical current through said substance to reduce the apparent diffusion coefficient of said substance; and
   obtaining a nuclear magnetic resonance signal from said substance resulting from said spins.

4. A method as claimed in claim 3 wherein said water-containing substance is selected from the group consisting of an electrolyte solution in a living body, and tissue in a living body.

5. A magnetic resonance imaging apparatus comprising:
   a basic field magnet which generates a homogenous static magnetic field in which a water-containing substance is disposed;
   a radio-frequency system which applies a radio-frequency magnetic field to said substance in said homogenous static magnetic field to excite nuclear spins therein;
   a gradient field system which generates at least one gradient magnetic field in said substance while said spins are excited;
   a current applicator adapted for interaction with said substance to apply an electrical current through said substance while said nuclear spins are excited therein to reduce at least one of a spin-lattice relaxation time and a spin-spin relaxation time of said substance;
   said radio-frequency system detecting magnetic resonance signals produced in said substance by said nuclear spins; and
   a computer system supplied with said magnetic resonance signals which generates a magnetic resonance image therefrom selected from the group consisting of a T1-weighted image and T2-weighted image.

6. A magnetic resonance imaging apparatus comprising:
   a basic field magnet which generates a homogenous static magnetic field in which a water-containing substance is disposed;
   a radio-frequency system which applies a radio-frequency field to said substance in said homogenous static magnetic field to excite nuclear spins in said substance;
   a gradient system which generates at least one gradient magnetic field in said substance while said nuclear spins are excited;
   said gradient system also generating motion probing gradient pulses in said substance while said spins are excited;
   an electrical current applicator adapted to apply an electrical current to said substance while said spins are excited therein to increase the apparent diffusion coefficient of said substance;
   said radio-frequency system obtaining magnetic resonance signals from said substance produced by said nuclear spins; and
   a computer system supplied with said nuclear magnetic resonance signals which generates a diffusion-weighted image of said substance therefrom.

* * * * *